FREQUENCY DIVIDER
Filed Aug. 24, 1949
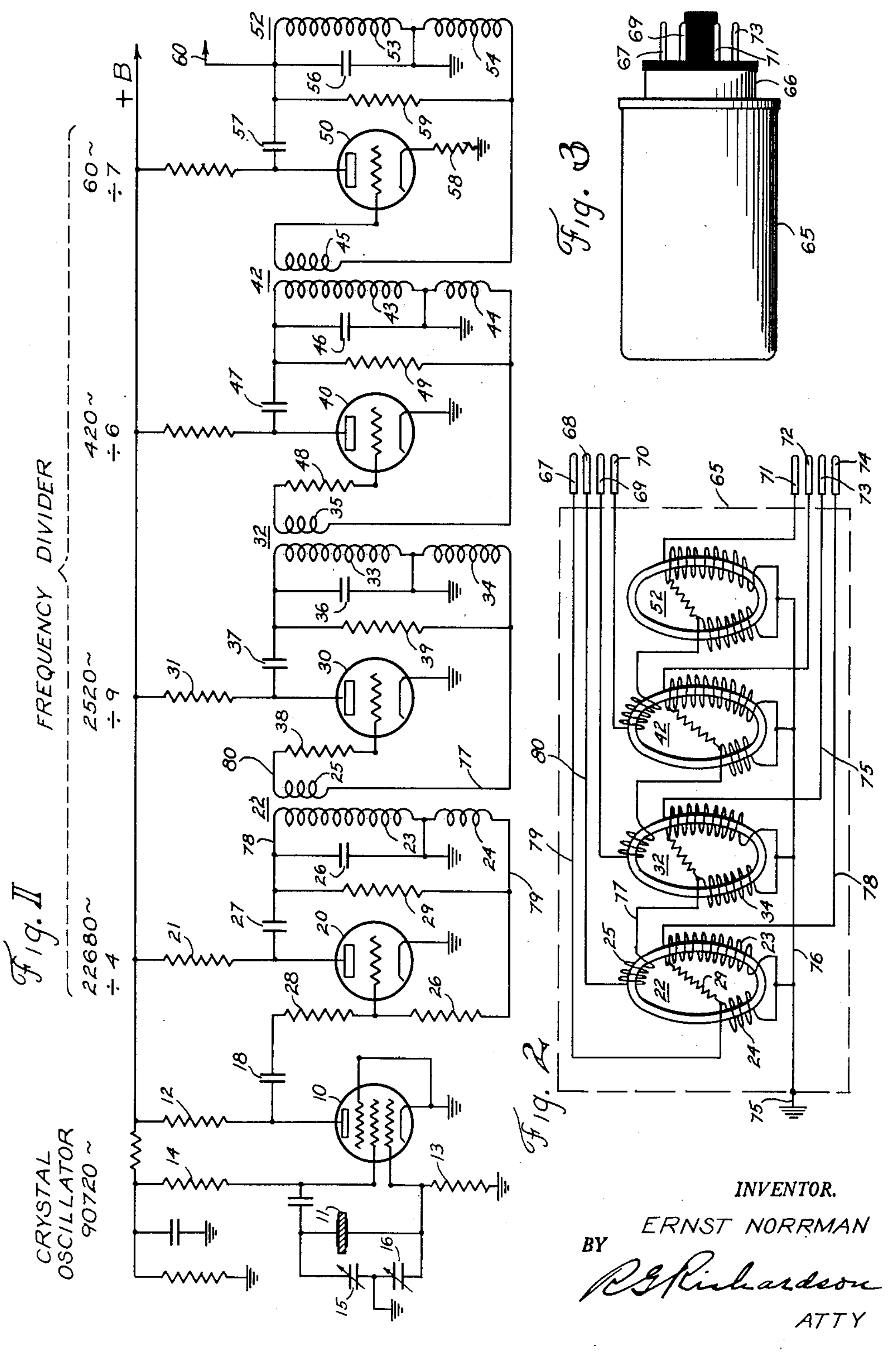
Fig. I, Fig. 2, Fig. 3
INVENTOR.
ERNST NORRMAN
BY R G Richardson
ATTY Patented Sept. 18, 1951 2,568,510

UNITED STATES PATENT OFFICE 2,568,510

FREQUENCY DIVIDER

Ernst Norrman, Williams Bay, Wis.

Application August 24, 1949, Serial No. 112,022

7 Claims. (Cl. 250—36)

The present invention relates to frequency dividers, such as are used in standard frequency generators, and the object of the invention is a new and improved device of this character.

In a standard frequency generator such as referred to herein, a crystal oscillator is employed as the constant frequency element. Crystal oscillators operate at high frequency while the generator output usually has a relatively low frequency, on the order of 60 cycles per second. The frequency divider functions to convert the high oscillator frequency to the required low output frequency.

Standard frequency generators which include crystal oscillators and frequency dividers are disclosed in my prior Patents Nos. 2,410,389 and 2,479,180. The frequency divider which is subject of the present invention may be considered as an improvement on the frequency dividers shown in these patents.

A feature of the present invention is a frequency divider comprising a plurality of oscillator stages and inductive coupling circuits by means of which each oscillator except the last controls the oscillator at the next stage at a submultiple frequency. The inductive coupling between any two stages preferably takes the form of a third winding on the transformer at the higher frequency stage which is connected in series in the grid circuit of the lower frequency stage.

A further feature is the provision of transformers for the several stages, usually four in number, in the form of toroidal coils each having primary, secondary, and coupling windings. These coils are of small size and may be packed in a metal container resembling an electron tube and equipped with a standard eight prong base. The container may be about 1½ inches in diameter and 2½ inches in length, exclusive of the base, and may be mounted on a standard socket along with the electron tubes. This makes an exceedingly compact arrangement, requiring a chassis of minimum size, which is easy to wire, and thus effects a considerable saving in the cost of manufacture.

The foregoing and other features of the invention will be described more in detail hereinafter, reference being had to the accompanying drawings, in which—

Fig. 1 is a diagrammatic circuit drawing of a standard frequency generator embodying the invention;

Fig. 2 is a diagrammatic representation of the toroidal coil transformers as packed in a container, showing the connections between the coils and the connections between the coils and the base; while Fig. 3 is a view of the container as it appears with the coils assembled therein.

Referring to the drawing, the standard frequency generator shown in Fig. 1 comprises a crystal oscillator and four modified Hartley oscillators constituting a frequency divider. The frequencies at which the several oscillators operate and the rates of division of the frequency divider oscillators are shown on the drawing. Thus the frequency of the crystal oscillator is 90,720 cycles per second, while the four oscillators of the frequency divider have frequencies of 22,680, 2,520, 420, and 60 cycles per second, respectively, and divide by 4, 9, 6, and 7, respectively. The output, taken from the last stage oscillator, has a frequency of 60 cycles per second. It will be understood that the invention is not limited to the frequencies mentioned, which are given by way of example.

Describing the circuits more in detail, the reference character 10 indicates a suitable space discharge device, which may be a type 6SJ7 pentode. This tube functions as a combined oscillator and amplifier tube. The crystal is indicated at 11 and is connected to the control grid and to the screen grid of the tube as shown. The screen grid functions as the anode in this circuit and is supplied with a positive potential through the resistor 14, which may have a value of 500 M ohms. The control grid is connected to ground through the grid resistor 13, which may have a value of one meg-ohm. The condensers 15 and 16 are connected in series across the crystal 11 and have their junction connected to ground. These condensers are small trimmer condensers which are provided to tune the crystal to the exact frequency at which it is intended to operate.

The amplifier section of the tube includes the suppressor grid, which is connected to the cathode, and the plate or anode which is supplied with a positive potential through the resistor 12, of about 500 M ohms.

The first stage oscillator in the frequency divider comprises a space discharge device 20, which may be a type 6J5 triode. The cathode of the tube is grounded and the anode is connected to the +B lead through the resistor 21, the value of which may be 50 M ohms. There is a tuned circuit comprising the inductance 23 and the condenser 26 which is connected between the anode of the tube 20 and ground by means of the condenser 27. This condenser preferably has a value of .001 mf. The inductance 23 is the primary winding of the transformer 22. The secondary winding 24 of this transformer is connected to the control grid of tube 20 through the resistor 26. The reference character 29 indicates a load resistor which may have a value of 220 M ohms and is connected across the primary and secondary windings 23 and 24 of the transformer.

The first divider stage oscillator above described is controlled from the crystal oscillator by means of a coupling circuit which includes the condenser 18, the capacity of which may be 50 mmf., and 680 M ohm resistor 28.

The second stage oscillator of the frequency divider comprises the space discharge device 30, which may also be a type 6J5 triode. The anode is connected to the +B lead through resistor 31. The transformer 32 has the primary winding 33 which with the condenser 36 forms a tuned circuit which is connected to the anode of tube 30 by the condenser 37. This condenser may have a capacity of .005 mf. Load resistor 39 is similar to load resistor 29 of the first stage oscillator. The secondary winding 34 of transformer 32 is connected in the grid circuit of tube 30. In order to enable the oscillator to be controlled by the preceding oscillator this grid circuit includes a third winding 25 on the transformer 22. A resistor 38 of about 27 M ohms is also included in the circuit.

The third stage oscillator is similar to the preceding oscillators and comprises the tube 40 and transformer 42. The tuned circuit which includes transformer winding 43 and condenser 46 is connected to the anode of the tube 40 by means of a condenser 47, which in this case preferably has a capacity of .02 mf. The grid circuit of the tube includes the secondary winding 44 of the transformer 42, the resistor 48, and the third winding 35 on transformer 32.

The fourth stage oscillator is also similar to the preceding oscillators and comprises the tube 50 and transformer 52. Condenser 57 through which the tuned circuit 53—56 is connected to the anode of tube 50 may have a capacity of .25 mf. The grid circuit of the tube includes the secondary winding 54 of transformer 52 and the third winding 45 of the transformer 42. The resistor 58 is a grid biasing resistor, serving the same purpose as the resistor 48 in the grid circuit of tube 40.

The output circuit of the frequency divider includes conductor 60, which may lead to any suitable amplifier.

The tuned circuits at the oscillators have their circuit elements so selected that the oscillators are adapted to operate at the frequencies indicated. These frequencies decrease from stage to stage so that the values of capacity and inductance of the tuning elements increase from stage to stage. It has already been noted that the condensers 27, 37, 47, and 57 preferably have capacities of .001, .005, .02 and .25 microfarad, respectively. These condensers are coupling condensers but have considerable effect on the tuning.

The transformers are designed to have the necessary inductance in their primary windings to permit tuning to the desired frequencies, which means that the number of turns increases from stage to stage. With closed circuit transformer cores, the primary winding 23 may have 500 turns, for example, while primary windings 33, 43, and 53 may have 1,100, 2,200, and 4,000 turns, respectively. The condensers 26, 36, 46, and 56 have progressively larger capacities and are selected from a range of commercial condensers after testing the circuits to determine the capacity required at each stage.

The secondary windings of the transformers are preferably related to the primary windings in the manner described in my Patent No. 2,479,180 previously referred to. That is, two different primary to secondary ratios are employed, the ratio used at any given stage depending on whether the rate of division is odd or even. For an even division a higher ratio is desirable. Thus at the first stage, which divides by 4, the ratio is about 3 to 1, while at the second stage, which divides by 9, the ratio is about 3 to 2. The same principle is followed at the third and fourth stages.

The coupling winding 25 is a third or tertiary winding wound on the same core with the primary winding 23 and secondary winding 24 of transformer 22. The number of turns is so selected that the control voltage impressed on the grid of tube 30 bears the proper ratio to the voltage impressed on the grid by the secondary winding of the transformer 32. The exact number of turns for optimum range of control may be determined by trial, and depends on several factors, including the operating frequencies at the first and second stages and the rate of division at the second stage. In the case under consideration, with other values as given, I have found that very satisfactory operation is secured with a winding 25 comprising about 80 turns. If the second stage divided by an even number instead of an odd number the number of turns in winding 25 should be reduced by approximately one-half. This is because the primary to secondary turn ratio for even division is higher, resulting in a lower voltage impressed on the grid by the secondary winding, and requiring a smaller number of turns in the coupling winding in order to maintain the proper ratio between this voltage and the control voltage.

The coupling winding 35 on transformer 32 may have about 90 turns. While the rate of division at the third stage is even, and the voltage impressed on the grid by winding 44 is relatively low, the effect in reducing the number of turns in the coupling winding 35 is compensated by the increased number of turns in the primary winding 33 as compared to the number of turns in primary winding 23. The winding 35 therefor has approximately the same number of turns as winding 25. The number would be doubled if the rate of division at the third stage were odd instead of even.

The same considerations apply to determining the number of turns in the coupling winding 45. Assuming other values to be as given, about 360 turns will be found to be satisfactory.

It will be understood that the values given herein, including values of resistance and capacity, are furnished merely by way of example, to give a general idea of what is required and to aid in an understanding of the operation of the invention.

The transformers 22, 32, 42, and 52 preferably have closed magnetic circuits comprising continuous cores as shown diagrammatically in Fig. 2. The cores are relatively small in diameter and the complete transformers accordingly are only about 1¼″ in diameter. Since the flux external to the cores is exceedingly small, there is no objectionable magnetic coupling between cores, even when they are stacked close together side by side, and it is possible therefore to pack them in a single metal container such as shown in Fig. 3.

The container comprises a tubular metal can 65 which is about 1½ inches in diameter and 2½ inches long, and a base 66 having eight prong terminals 67—74, adapted to fit a standard terminal socket. The container 65 may therefore be mounted on a conventional chassis along with the tubes such as 10, 20, etc. and the crystal 11.

Certain connections between the windings of the transformers are made inside the container, or rather they are inside the container after the transformers have been assembled therein. Also the load resistors such as 29, 39, etc. are received in the container along with the transformers. This arrangement makes it possible to reduce the number of conductors outgoing from the container to two per transformer, or eight conductors altogether, exclusive of the conductor which is used for grounding the container.

The circuit connections are shown diagrammatically in Fig. 2, in which the container 65 is represented by the dotted rectangle. The conductor for grounding the container is indicated at 75 and may be attached in any suitable manner, as by soldering. Another conductor 76 is soldered to the inside wall of the container and is connected to the junction of the primary and secondary windings 23 and 24 of transformer 22 and to the junction of the primary and secondary windings in each of the other transformers. If a container having a nine prong base is used, the ground connection to the container is omitted and conductor 76 is connected to the ninth prong terminal in the base.

The load resistor 29 is connected across the primary and secondary windings 23 and 24 of transformer 22, and being of small dimensions may actually bridge the space inside the transformer as indicated. The load resistors 39, 49, and 59 are similarly mounted and connected in their respective transformers.

The free ends of the primary and secondary windings 23 and 24 are connected at their junctions with the terminals of the load resistor 29 to the conductors 78 and 79, respectively, which extend outside the container by way of prong terminals 74 and 67. The coupling winding 25 has one end connected to the secondary winding 34 of transformer 32 by means of a conductor 77 and has its other end connected to a conductor 80 which extends outside the container by way of the prong terminal 68. These conductors all have the same reference numerals applied in Fig. 1, so that they may readily be identified.

The connections at the other transformers are similar to those described and need not be explained in detail. It will be noted that there are three conductors outgoing from transformer 22, two conductors from each of transformers 32 and 42, and only one from transformer 52. This makes a total of eight conductors, or two per transformer as previously stated.

The operation of the standard frequency generator will doubtless be understood from the preceding description but may be explained briefly nevertheless. When the current is turned on, the crystal starts vibrating in known manner at its rated frequency, whereby the crystal oscillator and the associated amplifier become operative and a fluctuating voltage is made available at the anode of tube 10 for use in controlling the first stage oscillator of the frequency divider. This voltage has a frequency of 90,720 cycles per second and may be adjusted at the factory to the exact value by means of the condensers 15 and 16.

The first stage oscillator of the frequency divider is tuned to operate over a frequency range which includes a frequency of 22,680 cycles per second. It is controlled at that frequency by control voltages transmitted from the anode circuit of tube 10 over a control circuit which leads to the grid of tutbe 20 by way of the condenser 18 and the resistor 28.

The second stage oscillator is tuned for operation over a frequency range which includes a frequency of 2,520 cycles per second. It is controlled at that frequency by control voltages which are generated in the winding 25 of transformer 22 at the first stage. These control voltages, having a frequency of 22,680 cycles per second, are superimposed on the 2,520 cycle voltages generated by the secondary winding 34 in the grid circuit of the tube 30 and effect control of the oscillator as stated.

The third stage oscillator comprising tube 40 has an operational frequency range which includes a frequency of 420 cycles per second. The grid circuit of the tube includes the secondary winding of transformer 44 and also includes the winding 35 of transformer 32 at the preceding stage. Control voltages generated in winding 35 effect control of the oscillator at the frequency of 420 cycles per second.

The fourth stage oscillator comprising tube 50 is adapted to operate over a frequency range which includes the desired output frequency of 60 cycles per second. Control of the oscillator at that frequency is accomplished by control voltages generated in winding 45 of transformer 42, said winding being included in the grid circuit of tube 50.

The operation of the fourth stage oscillator at a frequency of 60 cycles per second produces alternating voltages of that frequency in the associated tuned circuit, which are transmitted over the output conductor 60 to an amplifier. The amplifier output may be used for driving a small constant speed motor or for any other purpose requiring alternating current of constant frequency.

The invention having been described that which is believed to be new and for which the protection of Letters Patent is desired will be pointed out in the appended claims.

I claim:

1. In a frequency divider, first and second oscillators each including a grid controlled space discharge device, a tuned plate circuit including the primary winding of a transformer, and a grid circuit including the secondary winding of such transformer, the plate circuit of the second oscillator being tuned to a frequency which is submultiple of the frequency to which the plate circuit of the first oscillator is tuned, and means whereby the first oscillator controls the second oscillator at said submultiple frequency, said means comprising a third winding on the transformer at the first oscillator and inductively related to the other windings thereon, and a connection between said third winding and the grid circuit of said second oscillator whereby the voltages induced in said third winding are superimposed on the voltages applied to the grid circuit of the second oscillator by the secondary winding of the transformer at the second oscillator.

2. A frequency divider as claimed in claim 1, wherein the number of turns in the third winding on the transformer at the first oscillator depends in part on whether the frequency of the second oscillator is an odd or even submultiple of the frequency of the first oscillator and is greater if the frequency is an odd submultiple.

3. In a frequency divider, an oscillator including a grid controlled space discharge device, a tuned plate circuit including the primary winding of a transformer, and a grid circuit including the secondary winding of said transformer, a plurality of similar oscillators having their plate circuits so tuned that they operate at successively lower submultiple frequencies, coupling means for each pair of adjacent oscillators comprising a third winding on the transformer of the first oscillator of the pair connected in series in the grid circuit of the second oscillator of the pair, cores for said transformers having closed magnetic circuits, a container enclosing said transformers, and a base for said container having a plurality of terminals to which the windings of said transformers are connected.

4. In a frequency divider as claimed in claim 3, wherein the container for the transformers is made of metal and is grounded, connections to the container from one end of each primary winding and from one end of each secondary winding.

5. A frequency divider as claimed in claim 3, wherein the coupling between each pair of oscillators includes a connection inside the container between the third winding of the transformer in the first oscillator of the pair and the secondary winding of the transformer in the second oscillator of the pair.

6. A frequency divider as claimed in claim 3, wherein each oscillator includes a load resistor, and wherein the load resistors are located inside the container and are connected inside the container across the primary and secondary windings of the associated transformers.

7. In a frequency divider, an oscillator including a grid controlled space discharge device, a tuned plate circuit including the primary winding of a transformer, and a grid circuit including the secondary winding of said transformer, a plurality of similar oscillators having their plate circuits so tuned that they operate at successively lower submultiple frequencies, coupling means for transmitting control voltages from the first oscillator of each pair of adjacent oscillators to the second oscillator of the pair, cores for said transformers having closed magnetic circuits, a container in which said transformers are packed side by side, and a plug-in base for said containers having a plurality of prong terminals to which the windings of said transformers are connected.

ERNST NORRMAN.

No references cited.